(12) United States Patent
Sato (10) Patent No.: US 10,020,250 B2
(45) Date of Patent: Jul. 10, 2018

(54) INTERPOSER, MODULE, AND METHOD OF PRODUCING INTERPOSER

(71) Applicant: SONY CORPORATION, Tokyo (JP)

(72) Inventor: Junichi Sato, Oita (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/541,080

(22) PCT Filed: Dec. 16, 2015

(86) PCT No.: PCT/JP2015/085182
§ 371 (c)(1),
(2) Date: Jun. 30, 2017

(87) PCT Pub. No.: WO2016/117245
PCT Pub. Date: Jul. 28, 2016

(65) Prior Publication Data
US 2018/0019198 A1     Jan. 18, 2018

(30) Foreign Application Priority Data

Jan. 21, 2015 (JP) ................................. 2015-009204

(51) Int. Cl.
*H01L 23/498* (2006.01)
*H01L 23/14* (2006.01)
(Continued)

(52) U.S. Cl.
CPC ...... *H01L 23/49838* (2013.01); *H01L 21/486* (2013.01); *H01L 21/4857* (2013.01);
(Continued)

(58) Field of Classification Search
CPC ........... H01L 23/49838; H01L 21/6835; H01L 23/49822; H01L 24/16; H01L 21/486;
(Continued)

(56) References Cited

U.S. PATENT DOCUMENTS

| 9,374,889 B2* | 6/2016 | Murayama | H05K 1/0271 |
| 2012/0234589 A1* | 9/2012 | Furuichi | H05K 3/4682 |
| | | | 174/261 |

FOREIGN PATENT DOCUMENTS

| JP | 2004-111415 A | 4/2004 |
| JP | 2004111415 A * | 4/2004 |

(Continued)

OTHER PUBLICATIONS

International Search Report and Written Opinion of PCT Application No. PCT/JP2015/085182, dated Feb. 23, 2016, 01 pages of English Translation and 05 pages of ISRWO.

*Primary Examiner* — Fernando L Toledo
*Assistant Examiner* — Adam S Bowen
(74) *Attorney, Agent, or Firm* — Chip Law Group (57) ABSTRACT

To achieve an interposer being capable of corresponding to a variety of pitch conversions and being inexpensive as compared to the one in the related art. An interposer including a resin lamination including connection terminals for a main board on one surface, and a glass sheet that is fixed along another surface of the resin lamination, the glass sheet having an exposed portion exposed from the resin lamination, the exposed portion being at least a part of a surface not facing to the resin lamination, the glass sheet including connection terminals for a semiconductor device on a surface of the exposed portion, and wiring being formed on a surface of the exposed portion to interconnect the connection terminals with an edge of the exposed portion.

12 Claims, 4 Drawing Sheets

(51) Int. Cl.
*H01L 23/00* (2006.01)
*H01L 21/48* (2006.01)
*H01L 21/683* (2006.01)

(52) U.S. Cl.
CPC ........ *H01L 21/6835* (2013.01); *H01L 23/145* (2013.01); *H01L 23/49811* (2013.01); *H01L 23/49822* (2013.01); *H01L 24/16* (2013.01); *H01L 2221/68345* (2013.01); *H01L 2221/68359* (2013.01); *H01L 2224/16227* (2013.01)

(58) Field of Classification Search
CPC ............... H01L 23/145; H01L 21/4857; H01L 23/49811; H01L 2221/68345; H01L 2224/16227; H01L 2221/68359
USPC ........................................................ 257/774
See application file for complete search history.

(56) References Cited

FOREIGN PATENT DOCUMENTS

WO       2009/028596 A1    3/2009
WO   WO 2009028596 A1 *  3/2009 ....... H01L 23/49822

* cited by examiner

INTERPOSER, MODULE, AND METHOD OF PRODUCING INTERPOSER

CROSS REFERENCE TO RELATED APPLICATIONS

This application is a U.S. National Phase of International Patent Application No. PCT/JP2015/085182 filed on Dec. 16, 2015, which claims priority benefit of Japanese Patent Application No. JP 2015-009204 filed in the Japan Patent Office on Jan. 21, 2015. Each of the above-referenced applications is hereby incorporated herein by reference in its entirety.

TECHNICAL FIELD

The present technology relates to an interposer, a module, and a method of producing the interposer.

BACKGROUND ART

A pad pitch of a semiconductor chip that becomes rapidly finer and a pad pitch of a board (mount board) on which the semiconductor chip is mounted are different by more than an order of magnitude. This makes it difficult to reflect performance of a high performance and high functional chip obtained by progress in the semiconductor technology on a device or a system.

For example, a pad pitch of a practically usable semiconductor chip becomes 50 μm or less. In contrast, a pad pitch of a mount board (for example, printed board) is about 500 μm. It is estimated that the pad pitch of the semiconductor chip becomes finer in the coming years along with a scaling rule. However, it is believed that a development of the mount board having a fine pad pitch is relatively slow.

An interposer is to convert correspondingly a wiring pitch between the narrow pad pitch of the semiconductor chip and the wide pad pitch of the mount board, and is generally a silicon interposer using silicon. However, the silicon interposer is very expensive in terms of a material, and is also very expensive in terms of a process that needs an apparatus and a technique for preprocess.

Here, Patent Literatures 1 and 2 each discloses a technique that a build-up wiring board formed by multi-layering fine-pitch wiring corresponding to specifications of the silicon interposer is used in combination, and the silicon interposer and the build-up wiring board are resin-molded together.

CITATION LIST

Patent Literature

Patent Literature 1: Japanese Patent Application Laid-open No. 2008-166327
Patent Literature 2: Japanese Patent Application Laid-open No. 2009-141041

DISCLOSURE OF INVENTION

Technical Problem

The technique described in each of the Patent Literatures 1 and 2 described above tries to perform a pitch conversion by a method of embedding the silicon interposer into resin, and perform the pitch conversion using vias penetrating through front and rear surfaces in a substantially perpendicular direction.

Therefore, in a case where the pitch of the semiconductor device is converted to the pitch of organic resin, a pitch amount capable of offsetting at the time of penetrating the vias of one silicon layer is limited. In the pitch conversion requiring a large amount of offset, it arises a need to form multiple silicon layers and to offset the pitch over several times.

However, it should be appreciated that silicon is a very expensive material, is also very expensive in terms of a process that needs an apparatus and a technique for preprocess. In a case where multilayered silicon is used for the pitch conversion, it leads to an additional increase in costs.

The present technology is made in view of the above-mentioned circumstances, and it is an object of the present technology to achieve an interposer being capable of corresponding to a variety of pitch conversions and being inexpensive as compared to the one in the related art, a module, and a method of producing the interposer.

Solution to Problem

An interposer according to an aspect of the present technology includes a resin lamination including connection terminals for a main board on one surface, and a glass sheet that is fixed on another surface of the resin lamination, the glass sheet having an exposed portion exposed from the resin lamination, the exposed portion being at least a part of a surface not facing to the resin lamination, the glass sheet including connection terminals for a semiconductor device on a surface of the exposed portion, and wiring being formed on a surface of the exposed portion to interconnect the connection terminals with an edge of the exposed portion.

In addition, a module according to another aspect of the present technology includes an interposer, and a semiconductor device mounted on the interposer, the interposer including a resin lamination including connection terminals for a main board on one surface, and a glass sheet that is fixed along another surface of the resin lamination, the glass sheet having an exposed portion exposed from the resin lamination, the exposed portion being at least a part of a surface not facing to the resin lamination, the glass sheet including connection terminals for a semiconductor device on a surface of the exposed portion, and wiring being formed on a surface of the exposed portion to interconnect the connection terminals with an edge of the exposed portion.

In addition, a method of producing an interposer according to another aspect of the present technology includes
preparing a support having a flat surface, forming a wiring pattern on the flat surface of the support, placing a glass sheet on a region of the support, no wiring pattern being formed on the region, then covering the wiring pattern and the glass sheet with insulation resin, and forming a wiring layer that is electrically connected to the wiring pattern on the insulation resin, then separating the wiring pattern, the glass sheet, and the wiring layer that are integrated by the insulation resin from the support, and then forming, on a surface that does not face to the resin lamination of the glass sheet, connection terminals for a semiconductor device and wiring that interconnects the connection terminals with edges of the exposed portion.

It should be noted that the interposer and the module described above include a variety of aspects that are implemented by incorporating into other devices, together with other methods, or the like.

Advantageous Effects of Invention

The present technology can provide an interposer being capable of corresponding to a variety of pitch conversions and being inexpensive as compared to the one in the related art, a module, and a method of producing the interposer. It should be noted that the effects described in the present specification are merely illustrative and are not limitative, and may also have additive effects.

MODE(S) FOR CARRYING OUT THE INVENTION

Hereinafter, the present technology will be described in the following order.
(A) First Embodiment:
(B) Second Embodiment:
(C) Third Embodiment:

(A) First Embodiment

Figure 1:
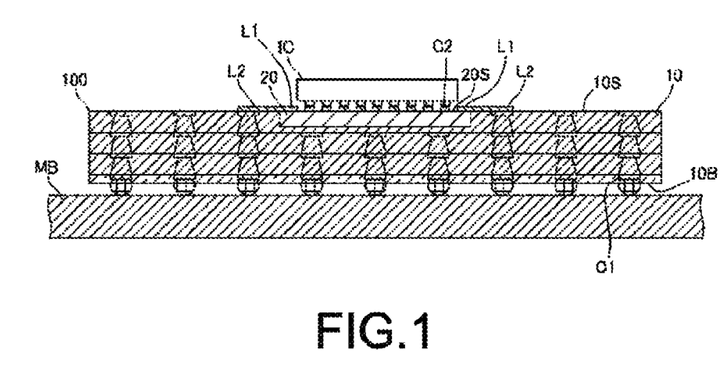
FIG. 1 is a cross-sectional view schematically showing an interposer according to a first embodiment the interposer.
Figure 2:
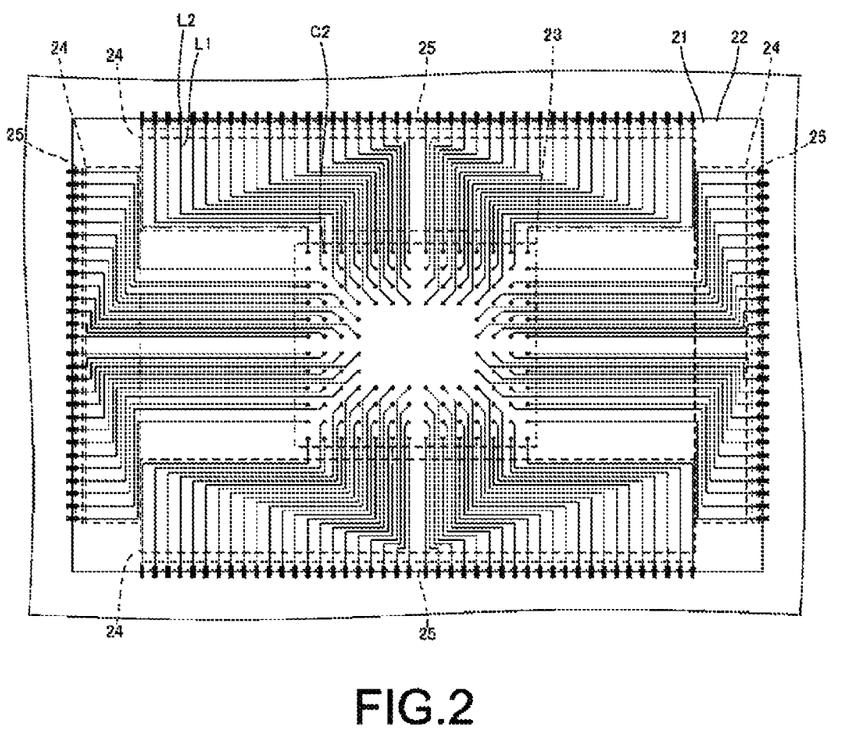
FIG. 2 is a view schematically showing a wiring structure of a surface of the interposer according to the first embodiment.

FIG. 1 is a cross-sectional view schematically showing an interposer 100 according to a first embodiment, and FIG. 2 is a view schematically showing a wiring structure of a surface of the interposer 100 according to the first embodiment.

The interposer 100 is interposed between a main board MB and a semiconductor device IC for a pitch conversion or the like, and can be integrated and modularized with at least one of the main board MB and the semiconductor device IC as necessary.

It should be noted that transmission lines that are used to transmit electric signals or the like on a board may be collectively referred to as "wiring" in the following description. For example, "patterning wiring" formed by patterning and "through electrode wiring" formed by through hole forming method may be referred to as "wiring".

The interposer 100 includes a resin lamination 10 and a glass sheet 20, and the glass sheet 20 is embedded in and fixed along a surface 10S of the resin lamination 10. Wiring formed on the resin lamination 10 is formed in a substantially entire region in a thickness direction from one surface 10S to another surface 10B. Specifically, the glass sheet 20 and the wiring formed on the resin lamination 10 are disposed in an overlapping positional relationship in the thickness direction of the resin lamination 10.

The surface 20S of the glass sheet 20 is smaller than the surface 10S of the resin lamination 10. The surface 10S of the resin lamination 10 includes a portion covered with the glass sheet 20 and a portion not covered with the glass sheet 20.

The surface 10S of the resin lamination 10 includes a plurality of connection terminals C1 that are used to connect the interposer 100 to the main board MB. The plurality of the connection terminals C1 are connected to connection terminals of the main board MB via a BGA (Ball Grid Array) or the like.

At least a part of the surface 20S of the glass sheet 20 not facing to the resin lamination 10 is an exposed portion 21 exposed from the resin lamination 10. A plurality of connection terminals C2 that are used to connect the glass sheet 20 to the semiconductor device IC are provided on the exposed portion 21 of the glass sheet 20. The minimum terminal interval between the connection terminals C2 is narrower than the minimum terminal interval between the connection terminals C1. The plurality of connection terminals C2 are connected to the connection terminals of the semiconductor device IC via the BGA (Ball Grid Array) or the like. The connection terminals C2 are formed of a conductive material (for example, aluminum or nickel) that is less subject to deterioration caused by solder molten or formation of an intermetallic compound layer (IMC).

On the resin lamination 10, the wiring is formed in a parallel direction and in a perpendicular direction to the surface 10S and the surface 10B. The wiring interconnects as appropriate to form a signal transmission line that electrically connects the surface 10S and the surface 10B of the resin lamination 10. It should be noted that the wiring may form a signal transmission line that electrically connects different points on the surface 10S or different points on the surface 10B.

Also, wiring L1 is formed on the exposed portion 21 of the glass sheet 20. At least a part of the wiring L1 formed on the exposed portion 21 is formed so as to connect at least a part of the connection terminals C2 formed on the exposed portion 21 to a periphery 22 of the glass sheet 20. The wiring L1 is formed to connect the connection terminals C2 to the periphery 22, and is connected to wiring L2 formed on the resin lamination 10 at the periphery 22.

As described above, it is possible to send and receive electric signals between the main board MB on which the interposer 100 is mounted and the semiconductor device IC mounted on the glass sheet 20 of the interposer 100 via the wiring L2 formed on the resin lamination 10, the wiring formed inside of the resin lamination 10, and the wiring L1 formed on the exposed portion 21 of the glass sheet 20 (and/or wiring of through holes 210 in a second embodiment as described later). It should be noted that, for example, in a case where the plurality of semiconductor devices IC are mounted on the surface 20S of the glass sheet 20, the wiring formed on the exposed portion 21 of the glass sheet 20 can also function as the wiring that connects the semiconductor devices IC. Thus, it is possible to accelerate the communication between the semiconductor devices IC and to decrease wiring areas.

Here, a minimum wiring width, a minimum wiring interval, and a minimum wiring pitch of the wiring that can be formed on the board are generally limited by a wiring patterning technique itself, and are also limited by technical constraints corresponding to surface properties of a material of the board to which the wiring patterning is applied. Specifically, the minimum width, the minimum interval, and the minimum pitch of the wiring pattern that can be formed on the surface of glass are generally narrower than the minimum width, the minimum interval, and the minimum pitch of the wiring pattern that can be formed on or in an organic resin board. Accordingly, the wiring disposed on the exposed portion 21 of the glass sheet 20 has the minimum wiring width, the minimum wiring interval, and the minimum wiring pitch narrower than those disposed on the wiring of the resin lamination 10. Similarly, the connection terminals C2 disposed on the exposed portion 21 of the glass sheet 20 have the widths, the intervals, and the pitches narrower than those of the connection terminals C1 disposed on the resin lamination 10.

Specifically, the wiring width, the wiring interval, and the wiring pitch of the wiring L1 patterned on the glass sheet 20 have limit values relating to fineness higher than those of the resin lamination. Thus, the connection terminals C2 for the semiconductor device IC that has a remarkably fine pad pitch in recent years are formed on the glass sheet 20 being capable of narrowing the pitch. Other portions such as the portion where the connection terminals C1 for the main board MB having not yet a fine pad pitch are formed of organic resin, to thereby suppressing cost rise.

It should be noted that the glass sheet 20 used in the interposer 100 has desirably a thickness smaller than a thickness of one layer of the resin lamination 10. In general, the thickness of one layer of the resin lamination 10 is about 50 μm or less. The glass sheet has desirably the thickness of 50 μm or less (excluding 0 μm), and more desirably about 45 μm or less (excluding 0 μm).

Further, the exposed portion 21 of the glass sheet 20 includes a first changing portion 24 that changes at least one of the wiring interval and the wiring pitch of the wiring L1 that connects the periphery 22 of the exposed portion 21 to a connection terminal forming region 23 where the connection terminals C2 for the semiconductor device IC are formed.

As described above, the wiring L1 is formed to connect the connection terminals C2 to the periphery 22 of the exposed portion 21. At least one of the wiring interval and the wiring pitch of the wiring L1 is changed in the first changing portion 24 provided on the way of the wiring L1. In this manner, on the glass sheet 20 having the pad pitch closer to the pad pitch of the semiconductor device IC, the pitch conversion can be performed between the semiconductor device IC and the resin lamination 10 having greatly different pad pitches each other.

In addition, the exposed portion 21 of the glass sheet 20 includes a second changing portion 25 that changes the wiring width in the wiring L1 that connects the periphery 22 of the exposed portion 21 to the connection terminal forming region 23 where the connection terminals C2 for the semiconductor device IC are formed. The second changing portion 25 is provided, for example, between the first changing portion 24 and the periphery 22 of the exposed portion 21.

As described above, the wiring L1 is formed to connect the connection terminals C2 to the periphery 22 of the exposed portion 21. The wiring width of the wiring L1 is changed in the second changing portion 25 provided on the way of the wiring L1. In this manner, it is possible to widen the narrow width of the wiring L1 formed on the glass sheet 20 being matched with the pad pitch of the semiconductor device IC on the way between the connection terminals C2 and the periphery 22 of the exposed portion 21. As a result, it is possible to effortlessly connect the wiring L1 to the wiring L2 having the wide width being matched with wiring limitation of the resin lamination 10.

Next, an example of a method of producing the interposer 100 according to this embodiment will be described with reference to FIGS. 3(a), 3(b), 3(c), 3(d) and 3(e) and FIGS. 4(f), 4(g), 4(h), 4(i) and 4(j).

Figure 3A:
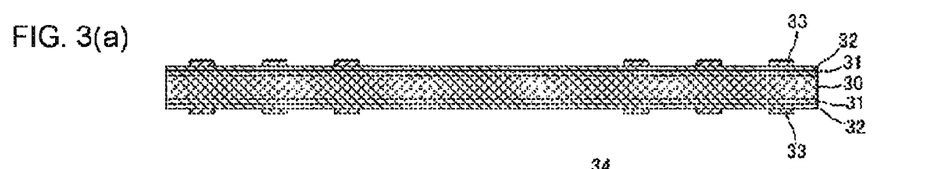
FIGS. 3(a), 3(b), 3(c), 3(d) and 3(e) are views illustrating a method of producing the interposer according to the first embodiment.

First, as shown in FIG. 3(a), a support 30 having flat surfaces 30a and 30a is prepared. Copper thin-films are formed on the flat surfaces 30a and 30a by vapor deposition or the like. In the example shown in FIG. 3(a), two copper thin-films 31 and 32 are formed sequentially on each of the flat surfaces 30a and 30a. Then, wiring patterns 33 are formed above and on the copper thin-films 31 and 32.

Figure 3B:
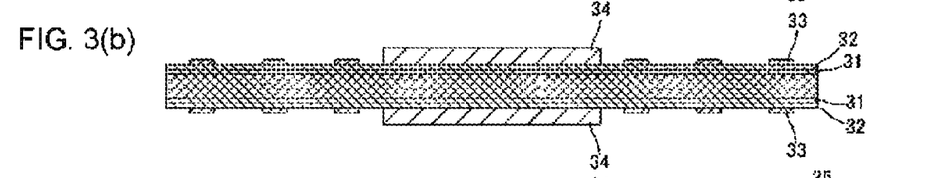

Next, as shown in FIG. 3(b), thin-film glass sheets 34 are disposed on predetermined areas above and on the copper thin-films 31 and 32 where no wiring patterns 33 are formed. In a case where sheet-like glass is disposed as the thin-film glass sheets 34, it is just enough to adhere the sheet-like glass to the surfaces of the copper thin-films 31 and 32. The sheet-like glass may be adsorbed on the surfaces of the copper thin-films 31 and 32, or may be adhered to the surfaces of the copper thin-films 31 and 32 by chemical adhesion treatment. The surfaces of the copper thin-films 31 and 32 may be subjected to chemical treatment for adhesion by attaching functional groups on the surface of the copper thin-films 31 and 32, to thereby adhere the sheet-like glass. It should be appreciated that an adhesive may be used to stick the sheet-like glass.

Figure 3C:
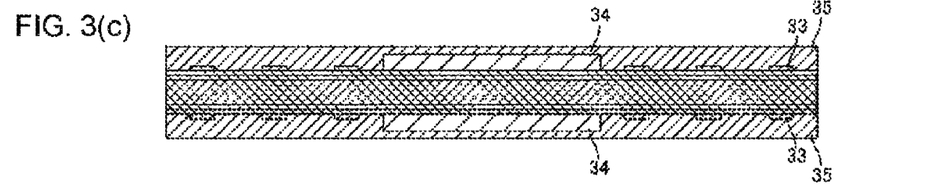

Next, organic resin is laminated over the glass sheets 34 and the wiring patterns 33 to form interlayer dielectric layers 35. The interlayer dielectric layers 35 are formed thicker than sheet thicknesses of the glass sheets 34 to embed entirely the glass sheet 34.

Figure 3D:
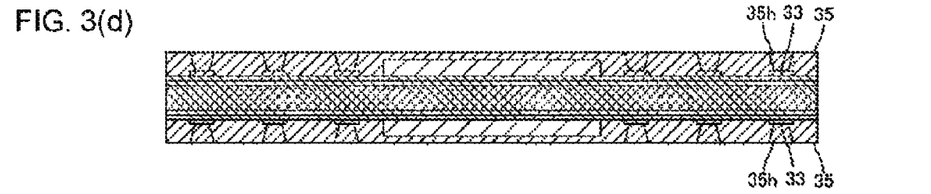
Figure 3E:
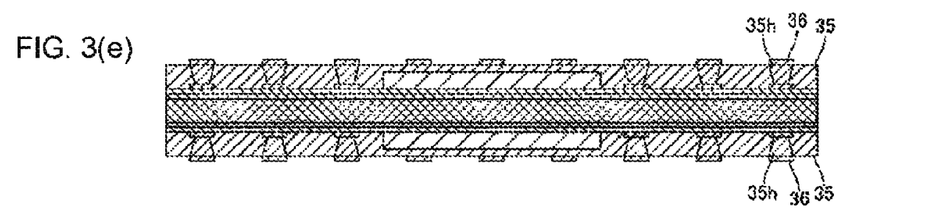

Next, as shown in FIG. 3(d), through holes 35h for exposing the wiring patterns 33 are formed in the interlayer dielectric layers 35. As shown in FIG. 3(e), wiring layers (wiring patterns 36) are formed to electrically connect the wiring patterns 33 via through holes 35h. The through holes 35h are formed, for example, by laser dry etching. The wiring patterns 36 are formed, for example, by a semi-additive method, a subtractive method, or a damascene method. The thus-formed through holes 35h and the wiring formed in the through holes 35h have shapes with reducing diameters as closer to the support 30.

Figure 4F:
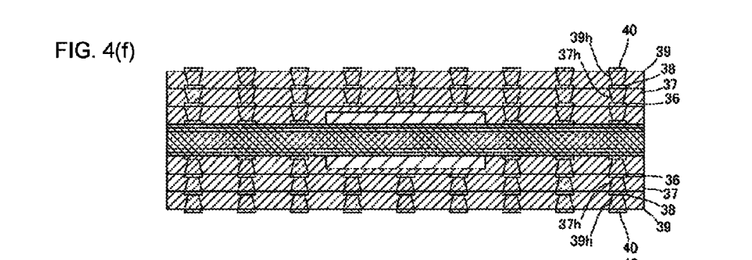
FIGS. 4(f), 4(q), 4(h), 4(i) and 4(j) are views illustrating a method of producing the interposer according to the first embodiment.

Next, after interlayer dielectric layers 37 are formed on the interlayer dielectric layers 35 so as to cover the wiring patterns 36, through holes 37h for exposing the wiring patterns 36 are formed in the interlayer dielectric layer 37. Similar to the formation of the wiring patterns 36, as shown in FIG. 4(f), wiring patterns 38 are formed using, for example, the semi-additive method. The through holes 37h are formed, for example, by laser dry etching. By repeating the process, in this embodiment, two interlayer dielectric layers 37 and 39, wiring patterns 38 and 40 at boundaries, and through holes 37h and 39h penetrating through the interlayer dielectric layers 37 and 39 are formed. It should be noted that the number of the interlayer dielectric layers and the wiring patterns are not limited to the above, and one or more interlayer dielectric layers and one or more wiring patterns may be formed.

It should be noted that the interlayer dielectric layer may be reinforced by using resin containing glass cloth in order to prevent the interposer from being bent. However, the resin containing glass cloth may slightly deteriorate electrical properties.

In view of the above-mentioned properties, for example, the interlayer dielectric layer 37 formed at an intermediate position between a front surface and a rear surface of the interposer 100 is made of the resin containing glass cloth.

Thus, wiring can be formed such that the signals at the semiconductor device IC side, which have to be processed at high speed, do not pass through the resin containing glass cloth. In this manner, the interposer 100 is prevented from being bent at the same time.

Figure 4G:
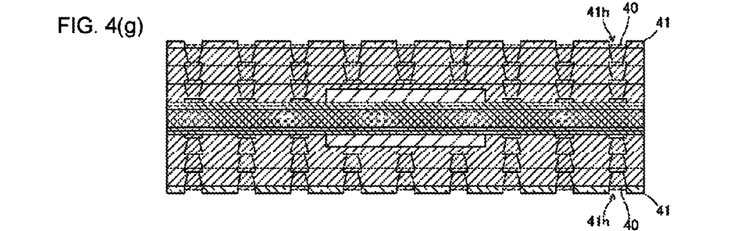

Next, as shown in FIG. 4(g), after solder resist 41 is formed, for example, by printing as resist films having insulation properties and heat resistance properties that cover outermost layers of built-up layers, openings 41h are formed to expose parts of wiring patterns 40. The wiring patterns 40 exposed from the openings 41h are used as the connection terminals C1. The openings 41h are formed, for example, by anisotropic dry etching using laser, or a photolithography technique.

Figure 4H:
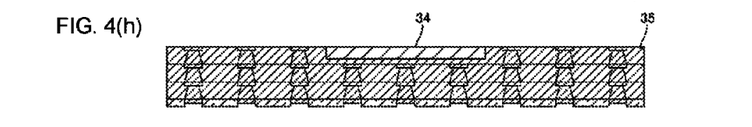

Next, as shown in FIG. 4(h), each interposer 100 is separated from the support 30, the copper thin-films 31 and 32 on the surface of the interposer 100 are removed by etching. At this time, the surface of the glass sheet 34 is formed substantially flush with the surface of the interlayer dielectric layer 35 therearound. In this manner, the glass sheet 34 is semi-embedded in and fixed along the interlayer dielectric layer 35, and boundaries between the glass sheet 34 and the interlayer dielectric layer 35 have almost no difference in level. As to the wiring formed along the surface of the interposer 100, gaps are less likely to be generated between wiring 42a formed on the glass sheet 34 and wiring 42b formed on the interlayer dielectric layer 35 as described later.

Figures 4I, 4J:
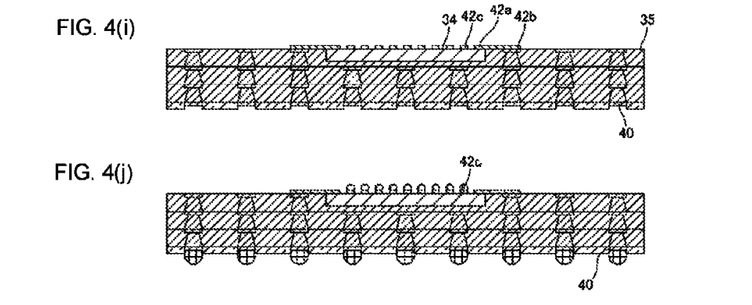

Next, as shown in FIG. 4(i), at the stage of exposing the wiring pattern 33, connection terminals 42c and the wiring 42a on the surface of the glass sheet 34, and the wiring 42b on the surface of the interlayer dielectric layer 35 that is connected to the wiring 42a are formed. In FIG. 1 and FIG. 2, the connection terminals 42c correspond to the above-described connection terminals C2, the wiring 42a corresponds to the above-described wiring L1, and the wiring 42b corresponds to the above-described wiring L2.

The wiring 42a, the wiring 42b, and the connection terminals 42c are desirably formed of aluminum or nickel in order to inhibit durability deterioration caused by solder molten on the connection terminals 42c and the wiring 42a or formation of an intermetallic compound layer (IMC). As shown in FIG. 4(j), ball grid array electrodes are provided on the connection terminals 42c and the connection terminals 40 by applying molten solder with a dispenser, the ball grid array electrodes being formed in hemispherical shapes by the surface tension of the solder.

By the production method as described above, the interposer 100, in which an exposed surface of the glass sheet 34 not facing to the interlayer dielectric layer 35 is substantially flush with the surface of interlayer dielectric layer 35, is produced.

(B) Second Embodiment

Figure 5:
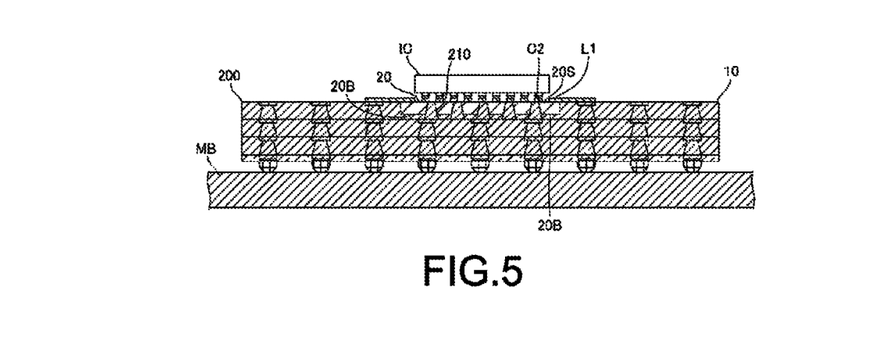
FIG. 5 is a view illustrating an interposer according to a second embodiment.
Figure 6:
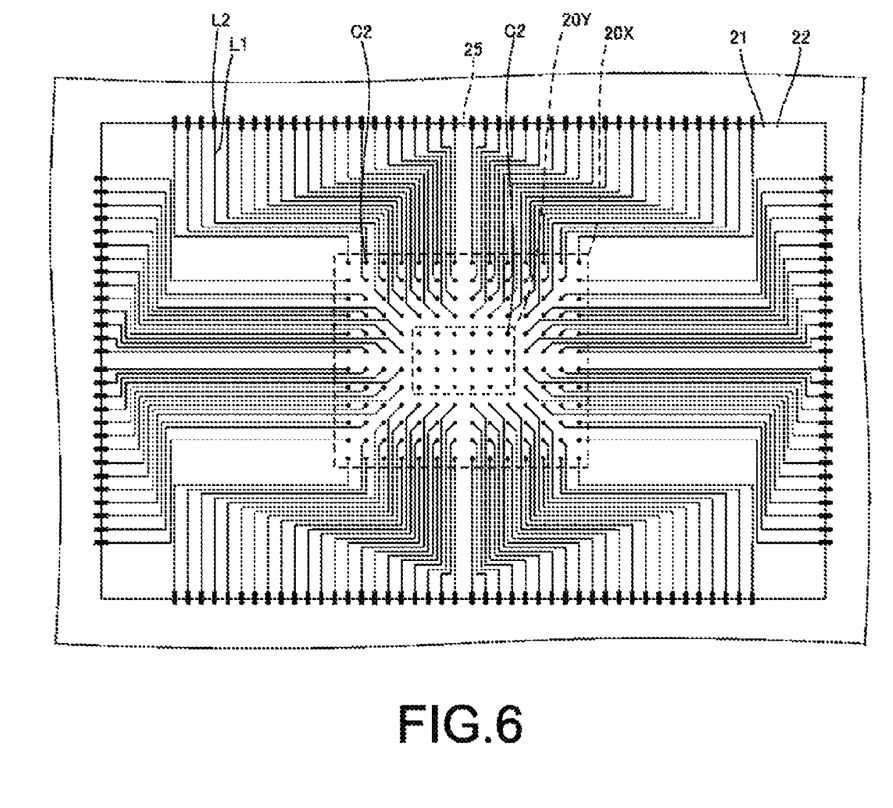
FIG. 6 is a view illustrating the interposer according to the second embodiment.

Next, with reference to FIG. 5 and FIG. 6, an interposer 200 according to a second embodiment will be described. The interposer 200 has the similar configuration as the interposer 100 according to the first embodiment except that the glass sheet is provided with through holes. Thus, the configurations common to the interposer 100 according to the first embodiment are described by denoting the same reference signs.

Through holes 210 (so-called via holes) penetrating through front and rear surfaces of the glass sheet 20 are formed in the interposer 200. The connection terminals C2 are formed on the surface 20S of the glass sheet 20 corresponding to the through holes 210. Plating or Cu (or Ag) paste is applied to the through holes 210. The through holes 210 electrically connect the connection terminals C2 formed on the surface 20S of the glass sheet 20 to the wiring formed in the resin lamination 10 at the surface 20B side of the glass sheet 20.

Thus, the glass sheet 20 having the through holes 210 increases the degree of freedom in connecting the connection terminals of the semiconductor device IC to the wiring in the resin lamination 10. Specifically, the connection terminals of the semiconductor device IC can be connected to the wiring in the resin lamination 10 via the wiring L1 formed along the surface 20S of the glass sheet 20, or can also be connected via the through hole 210.

Accordingly, in a case where it is difficult to run the wiring L1 through spaces of the connection terminals C2, it is possible to select the connection via the through holes 210. Thus, it increases the degree of design freedom of the wiring L1. As a result, the production costs of the wiring L1 can be suppressed. In addition, in a case where the wiring L1 that can be formed on the glass sheet 20 has insufficient quality to transmit necessary signals, the wiring via the through holes 210 is selected to increase the wiring width of the through holes 210, thereby ensuring sufficient quality to transmit the necessary signals.

For example, a central portion 20Y in a range 20X of the glass sheet 20 covered by the semiconductor device IC mounted on the interposer 100 is provided with the through holes 210. The connection terminals C2 provided at the central portion of the semiconductor device IC are connected to the wiring in the resin lamination 10 via the through holes 210. The connection terminals C2 provided at the portions other than the central portion 20Y of the semiconductor device IC are connected to the wiring in the resin lamination 10 via the wiring L1 formed along the surface 20S of the glass sheet 20 and the wiring L2 connected to the wiring L1. Thus, the connection terminals C2 can be connected differently.

More specifically, for example, it is possible to use differently the through holes 210 as wiring for a power supply or ground, and the wiring L1 and the wiring L2 as wiring for transmitting signals. In this case, the radius of each of the connection terminals C2 formed by the through holes 210 for the power source and the ground is made greater than the radius of each of the other connection terminals. With this structure, it is possible to stabilize a power source voltage and a ground voltage supplied to the semiconductor device IC.

(C) Third Embodiment

Figure 7:
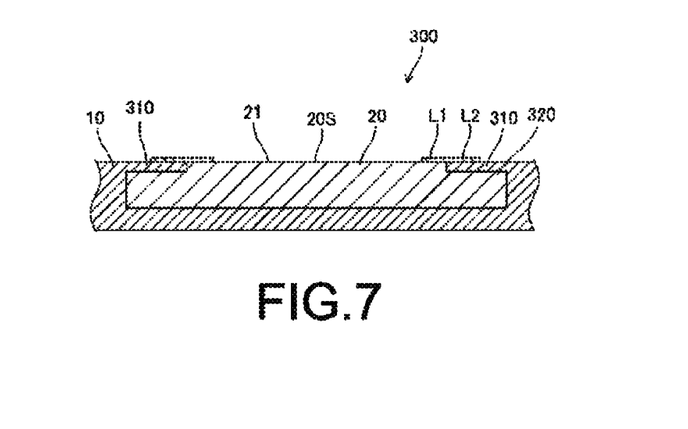
FIG. 7 is a view illustrating an interposer according to a third embodiment.

Next, with reference to FIG. 7, an interposer 300 according to a third embodiment will be described. The interposer 300 has the similar configuration as the interposer 100 according to the first embodiment except that a periphery of the glass sheet is provided with a wraparound portion formed of organic resin. Thus, the configurations common to the interposer 100 according to the first embodiment are described by denoting the same reference signs.

On the exposed portion 21 of the glass sheet 20 not facing to the resin lamination 10, the interposer 300 includes a wraparound portion 310 where the organic resin of the resin lamination 10 wraps around a periphery 320 of the surface 20S of the glass sheet 20. Accordingly, the wiring L2 sequentially formed on the wiring L1 formed on the glass sheet 20 is provided over the wraparound portion 310. In this manner, possible disconnection of the wiring L2 arising from a difference of linear expansion between glass and resin can be inhibited.

The wraparound portion 310 may be piled on the periphery of the glass sheet 20. However, in a case where the support 30 is used according to the production method described in the first embodiment above, the wraparound portion 310 may be formed by producing a level different portion that is one-level lower than the central portion of the glass sheet 20 or a tapered portion that is gradually lower than the central portion of the glass sheet 20.

Specifically, the glass sheet 20 is adhered to the copper thin-films 31 and 32 such that the surface on which the level different portion or the tapered portion is formed faces to the support 30. The organic resin is laminated thereon, and is allowed to enter into the level different portion or the tapered portion at the periphery of the glass sheet 20. Thus, the glass sheet 20 including the organic resin of the wraparound portion 310 can be flush with the resin lamination 10 as a whole. In this manner, the interposer 300 according to this embodiment can be produced similar to the production method of the first embodiment described above.

It should be noted that the present technology is not limited to embodiments described above, a configuration that the respective components disclosed in the respective embodiments described above are substituted each other or changed in combination, a configuration that the respective components disclosed in the prior art and in the respective embodiments described above are substituted each other or changed in combination, or the like are also included. Further, the technical scope of the present technology is not limited to the embodiments described above, but extends to equivalents thereof as the entries of the claims.

The present technology may have the following configurations.

(1) An interposer, including:
a resin lamination including connection terminals for a main board on one surface; and
a glass sheet that is fixed on another surface of the resin lamination,
the glass sheet having an exposed portion exposed from the resin lamination, the exposed portion being at least a part of a surface not facing to the resin lamination, the glass sheet including connection terminals for a semiconductor device on a surface of the exposed portion, and wiring being formed on a surface of the exposed portion to interconnect the connection terminals with an edge of the exposed portion.

(2) The interposer according to (1), in which
the glass sheet is embedded in and fixed along the other surface of the resin lamination.

(3) The interposer according to (1) or (2), in which
a minimum wiring interval of the wiring formed on the exposed portion of the glass sheet is narrower than a minimum wiring interval of wiring formed on the resin lamination.

(4) The interposer according to any one of (1) to (3), in which
a minimum wiring width of the wiring formed on the exposed portion of the glass sheet is narrower than a minimum wiring width of wiring formed on the resin lamination.

(5) The interposer according to any one of (1) to (4), in which
a minimum wiring pitch of the wiring formed on the exposed portion of the glass sheet is narrower than a minimum wiring pitch of wiring formed on the resin lamination.

(6) The interposer according to any one of (1) to (5), in which
the glass sheet has a thickness of 50 µm or less (excluding 0 µm).

(7) The interposer according to any one of (1) to (6), in which
the exposed portion of the glass sheet includes a first changing portion that changes at least one of a wiring interval and a wiring pitch between a connection terminal forming region and a periphery of the exposed portion, the connection terminals for the semiconductor device being formed in the connection terminal forming region.

(8) The interposer according to any one of (1) to (7), in which
the exposed portion of the glass sheet includes a second changing portion that changes a wiring width between a connection terminal forming region and a periphery of the exposed portion, the connection terminals for the semiconductor device being formed in the connection terminal forming region.

(9) The interposer according to any one of (1) to (8), in which
the exposed portion of the glass sheet is substantially flush with the other surface of the resin lamination.

(10) The interposer according to any one of (1) to (9), in which
the resin lamination includes a through electrode extending in a direction substantially perpendicular to the one surface and the other surface, and
the through electrode has a hole shape with a reducing diameter as closer to the other surface.

(11) A module, including:
an interposer; and
a semiconductor device mounted on the interposer,
the interposer including a resin lamination including connection terminals for a main board on one surface, and a glass sheet that is fixed along another surface of the resin lamination,
the glass sheet having an exposed portion exposed from the resin lamination, the exposed portion being at least a part of a surface not facing to the resin lamination, the glass sheet including connection terminals for a semiconductor device on a surface of the exposed portion, and wiring being formed on a surface of the exposed portion to interconnect the connection terminals with an edge of the exposed portion.

(12) A method of producing an interposer, including:
preparing a support having a flat surface;
forming a wiring pattern on the flat surface of the support;
placing a glass sheet on a region of the support, no wiring pattern being formed on the region;
then covering the wiring pattern and the glass sheet with insulation resin, and forming a wiring layer that is electrically connected to the wiring pattern on the insulation resin;
then separating the wiring pattern, the glass sheet, and the wiring layer that are integrated by the insulation resin from the support; and
then forming, on a surface that does not face to the resin lamination of the glass sheet, connection terminals for a semiconductor device and wiring that interconnects the connection terminals with edges of the exposed portion.

REFERENCE SIGNS LIST

10 resin lamination
10B surface
10S surface 20 glass sheet
20S surface
21 exposed portion
22 periphery
23 connection terminal forming region
24 first changing portion
25 second changing portion
30 support
30a flat surface
31 thin-film
32 thin-film
33 wiring pattern
34 glass sheet
35 interlayer dielectric layer
35h through hole
36 wiring pattern
37 interlayer dielectric layer
37h through hole
38 wiring pattern
39 interlayer dielectric layer
40 wiring pattern
41 solder resist
41h opening
42a wiring
42b wiring
42c connection terminal
100 interposer
200 interposer
210 through hole
300 interposer
310 wraparound portion
C1 connection terminal
C2 connection terminal
IC semiconductor device
L1 wiring
L2 wiring
MB main board

The invention claimed is:

1. An interposer, comprising:
a resin lamination including connection terminals for a main board on a first surface; and
a glass sheet that is fixed along a second surface of the resin lamination,
wherein the glass sheet has an exposed portion exposed from the resin lamination,
wherein the exposed portion is at least a part of a third surface not facing to the resin lamination, and
wherein the glass sheet includes connection terminals for a semiconductor device on a surface of the exposed portion, and wiring on a surface of the exposed portion to interconnect the connection terminals with an edge of the exposed portion.

2. The interposer according to claim 1, wherein the glass sheet is embedded in and fixed along the second surface of the resin lamination.

3. The interposer according to claim 1, wherein a minimum wiring interval of the wiring on the exposed portion of the glass sheet is narrower than a minimum wiring interval of wiring on the resin lamination.

4. The interposer according to claim 1, wherein a minimum wiring width of the wiring on the exposed portion of the glass sheet is narrower than a minimum wiring width of wiring on the resin lamination.

5. The interposer according to claim 1, wherein a minimum wiring pitch of the wiring on the exposed portion of the glass sheet is narrower than a minimum wiring pitch of wiring on the resin lamination.

6. The interposer according to claim 1, wherein the glass sheet has a thickness of 50 μm or less (excluding 0 μm).

7. The interposer according to claim 1, wherein the exposed portion of the glass sheet includes a first changing portion that changes at least one of a wiring interval and a wiring pitch between a connection terminal forming region and a periphery of the exposed portion, wherein the connection terminals for the semiconductor device are in the connection terminal forming region.

8. The interposer according to claim 1, wherein the exposed portion of the glass sheet includes a second changing portion that changes a wiring width between a connection terminal forming region and a periphery of the exposed portion,
the connection terminals for the semiconductor device are in the connection terminal forming region.

9. The interposer according to claim 1, wherein the exposed portion of the glass sheet is substantially flush with the second surface of the resin lamination.

10. The interposer according to claim 1, wherein the resin lamination includes a through electrode extending in a direction substantially perpendicular to the first surface and the second surface, and
the through electrode has a hole shape with a reducing diameter as closer to the second surface.

11. A module, comprising:
an interposer; and
a semiconductor device mounted on the interposer,
wherein the interposer includes a resin lamination including connection terminals for a main board on a first surface, and a glass sheet that is fixed along a second surface of the resin lamination,
wherein the glass sheet has an exposed portion exposed from the resin lamination, and
the exposed portion is at least a part of a third surface not facing to the resin lamination, the glass sheet including connection terminals for a semiconductor device on a surface of the exposed portion, and wiring on a surface of the exposed portion to interconnect the connection terminals with an edge of the exposed portion.

12. A method of producing an interposer, comprising:
preparing a support having a flat surface;
forming a wiring pattern on the flat surface of the support;
placing a glass sheet on a region of the support, no wiring pattern being formed on the region;
covering the wiring pattern and the glass sheet with insulation resin, and forming a wiring layer that is electrically connected to the wiring pattern on the insulation resin;
separating the wiring pattern, the glass sheet, and the wiring layer that are integrated by the insulation resin from the support; and
forming, on a surface that does not face to the resin lamination of the glass sheet, connection terminals for a semiconductor device and wiring that interconnects the connection terminals with edges of the surface.

* * * * *